(12) United States Patent
Ohno et al.

(10) Patent No.: US 11,469,682 B2
(45) Date of Patent: Oct. 11, 2022

(54) SEMICONDUCTOR DEVICE

(71) Applicant: Laser Systems Inc., Hokkaido (JP)

(72) Inventors: Yasuo Ohno, Kanagawa (JP); Hiroko Itoh, Hokkaido (JP)

(73) Assignee: LASER SYSTEMS INC., Hokkaido (JP)

(*) Notice: Subject to any disclaimer, the term of this patent is extended or adjusted under 35 U.S.C. 154(b) by 339 days.

(21) Appl. No.: 16/634,195

(22) PCT Filed: Jul. 27, 2018

(86) PCT No.: PCT/JP2018/028289
§ 371 (c)(1),
(2) Date: Jan. 27, 2020

(87) PCT Pub. No.: WO2019/022240
PCT Pub. Date: Jan. 31, 2019

(65) Prior Publication Data
US 2020/0177095 A1    Jun. 4, 2020

(30) Foreign Application Priority Data

Jul. 27, 2017   (JP) .............................. JP2017-145602

(51) Int. Cl.
*H02M 7/06* (2006.01)
*H01L 23/00* (2006.01)
*H01L 29/872* (2006.01)

(52) U.S. Cl.
CPC .............. *H02M 7/06* (2013.01); *H01L 24/45* (2013.01); *H01L 29/872* (2013.01)

(58) Field of Classification Search
CPC ............ H02M 7/02; H02M 7/04; H02M 7/06; H02M 7/066; H01L 24/45; H01L 29/872
See application file for complete search history.

(56) References Cited

U.S. PATENT DOCUMENTS 10,193,462 B1 *  1/2019  Leong .................. H02M 7/797
2009/0067208 A1 *  3/2009  Martin .................. H02J 50/001
                                                              363/126

(Continued)

FOREIGN PATENT DOCUMENTS

JP       08-335709 A     12/1996
JP       2014-023069 A    2/2014
WO       2016045722 A1    3/2016

OTHER PUBLICATIONS

International Search Report from International Application No. PCT/JP2018/028289 dated Oct. 23, 2018.

*Primary Examiner* — Gary L Laxton
(74) *Attorney, Agent, or Firm* — Brundidge & Stanger, P.C.

(57) ABSTRACT

This semiconductor device is provided with: a substrate which has, on a principal surface thereof, an input unit for inputting an alternating current power from the exterior, a ground connection unit for connecting to ground formed on the exterior, an output unit for outputting a post-adjustment direct current power to the exterior, and a semiconductor layer; a first Schottky barrier diode formed in a first region of the semiconductor layer so that a cathode electrode is connected to the input unit and so that an anode electrode is connected to the ground connection unit; a second Schottky barrier diode formed in a second region of the semiconductor layer so that a cathode electrode is connected to the output unit and so that an anode electrode is connected to the input unit; and a third Schottky barrier diode formed in a third region of the semiconductor layer so that a cathode electrode is connected to the output unit and so that an anode electrode is connected to the ground connection unit.

10 Claims, 16 Drawing Sheets

(56) References Cited

U.S. PATENT DOCUMENTS

| | | | |
|---|---|---|---|
| 2013/0242627 A1* | 9/2013 | Bedell | H01L 29/0634 |
| | | | 716/100 |
| 2016/0315478 A1* | 10/2016 | Chen | H02M 7/06 |
| 2017/0302192 A1 | 10/2017 | Hoerger et al. | |
| 2018/0294364 A1* | 10/2018 | Pak | H01L 29/0649 |

* cited by examiner

SEMICONDUCTOR DEVICE

TECHNICAL FIELD

The present disclosure relates to a semiconductor device.

BACKGROUND ART

There is known a rectifier circuit that rectifies high-frequency power in a microwave band and converts the same to DC power (hereinafter, referred to as "microwave rectifier circuit"; see Patent Literature (hereinafter, abbreviated as PTL) 1, for example).

For example, a microwave rectifier circuit is applied to a rectenna device that receives high-frequency electromagnetic waves by an antenna, or a power reception device that uses electromagnetic induction between coils.

Generally, a Schottky barrier diode, or Schottky diode (hereinafter, referred to as "SBD") that exhibits excellent performance with respect to high-speed operation and that has a small parasitic capacitance is used in such a microwave rectifier circuit. A semiconductor chip forming the SBD is normally mounted on a printed circuit board where an antenna (such as a dipole antenna) and the like are disposed, and is electrically connected to wiring formed on the printed circuit board by wire-bonding.

FIG. 1 is a diagram illustrating an example of a microwave rectifier circuit according to a conventional technique.

The microwave rectifier circuit in FIG. 1 is a voltage-doubler microwave rectifier circuit. The voltage-doubler microwave rectifier circuit includes first SBD 1, a cathode of which is connected to input terminal U1 and an anode of which is connected to GND terminal U2, second SBD 2, a cathode of which is connected to output terminal U3 and an anode of which is connected to input terminal U1, smoothing capacitor 3 that is disposed on an output side, and load resistor 4.

An area enclosed by a dotted line in FIG. 1 corresponds to a circuit region that is formed on semiconductor chip U' forming the SBD. As illustrated in FIG. 1, semiconductor chip U' of the SBD includes input terminal U1 to which high-frequency power is input, GND terminal U2, and output terminal U3 that outputs DC power rectified by the SBD. Furthermore, input terminal U1, GND terminal U2, and output terminal U3 are connected to external terminals P1, P2, P3 on printed circuit board P' by wire-bondings L1, L2, L3, respectively. Additionally, FIG. 1 illustrates a mode of receiving high-frequency electromagnetic waves from antenna A.

CITATION LIST

Patent Literature

PTL 1
Japanese Patent Application Laid-Open No. 2014-023069

SUMMARY OF INVENTION

Technical Problem

With the microwave rectifier circuit, high-frequency power is converted to DC by a rectifying action of the SBD. At this time, to achieve high conversion efficiency, only a voltage of the high-frequency power is desirably applied across terminals of the SBD. In other words, a voltage across terminals of the SBD is desirably maintained constant when the voltage of the high-frequency power is removed.

In this respect, with a general microwave rectifier circuit as illustrated in FIG. 1, potentials on printed circuit board P' are normally stably maintained by capacitors, the ground line, stubs and the like disposed on printed circuit board P'.

However, each of input terminal U1, GND terminal U2, and output terminal U3 of semiconductor chip U' is connected to the wirings on the printed circuit board P' by corresponding wire-bondings L1, L2, L3, and thus, the potential of each terminal U1, U2, U3 fluctuates under the influence of parasitic inductance of corresponding wire-bonding L1, L2, L3. As a result, ripples are caused in voltages that is applied across the terminals, i.e., the anode and the cathode, of first SBD 1 (hereinafter, abbreviated as "voltage across terminals") or in a voltage across terminals of second SBD 2, and the rectifying operation of first SBD 1 and second SBD 2 becomes unstable, and the power conversion efficiency will be reduced.

Furthermore, fluctuations in a voltage of each terminal U1, U2, U3 of semiconductor chip U' may cause resonance due to the parasitic inductance of wire-bonding L1, L2, L3 or the parasitic capacitance between semiconductor chip U' and printed circuit board P', and may cause an abnormal voltage across terminals of first SBD 1 or voltage across terminals of second SBD 2, thereby possibly destroying first SBD 1 or second SBD 2.

The present disclosure has been made in view of the circumstances described above, and an object of the present disclosure is to provide a semiconductor device capable of stable rectifying operation.

Solution to Problem

A primary part of the present disclosure, which solves the problems mentioned above is a semiconductor device that forms a rectifier circuit, the semiconductor device including:

a substrate including, on a main surface of the substrate, an input section to which AC power is input from outside, a ground connection section that is connected to a ground formed outside, an output section that outputs rectified DC power to outside, and a semiconductor layer;

a first Schottky diode that is formed in a first region of the semiconductor layer, with a cathode electrode being connected to the input section and an anode electrode being connected to the ground connection section;

a second Schottky diode that is formed in a second region of the semiconductor layer, with a cathode electrode being connected to the output section and an anode electrode being connected to the input section; and a third Schottky diode that is formed in a third region of the semiconductor layer, with a cathode electrode being connected to the output section and an anode electrode being connected to the ground connection section.

Advantageous Effects of Invention

With the semiconductor device according to the present disclosure, stable rectifying operation is enabled.

DESCRIPTION OF EMBODIMENTS

Hereinafter, preferable embodiments of the present disclosure will be described in detail with reference to the accompanying drawings. Additionally, in the present specification and the drawings, structural elements having a substantially same functional structure will be denoted by the same reference sign, and redundant descriptions thereof will be omitted.

Embodiment 1

<Structure of Microwave Rectifier Circuit>

In the following, an example of a microwave rectifier circuit to which semiconductor chip U (hereinafter, also referred to as "semiconductor device U") according to Embodiment 1 is applied will be described with reference to FIGS. 2 to 4. Like that in FIG. 1, the microwave rectifier circuit according to the present embodiment is a voltage-doubler microwave rectifier circuit that is formed on printed circuit board P.

Figure 2:
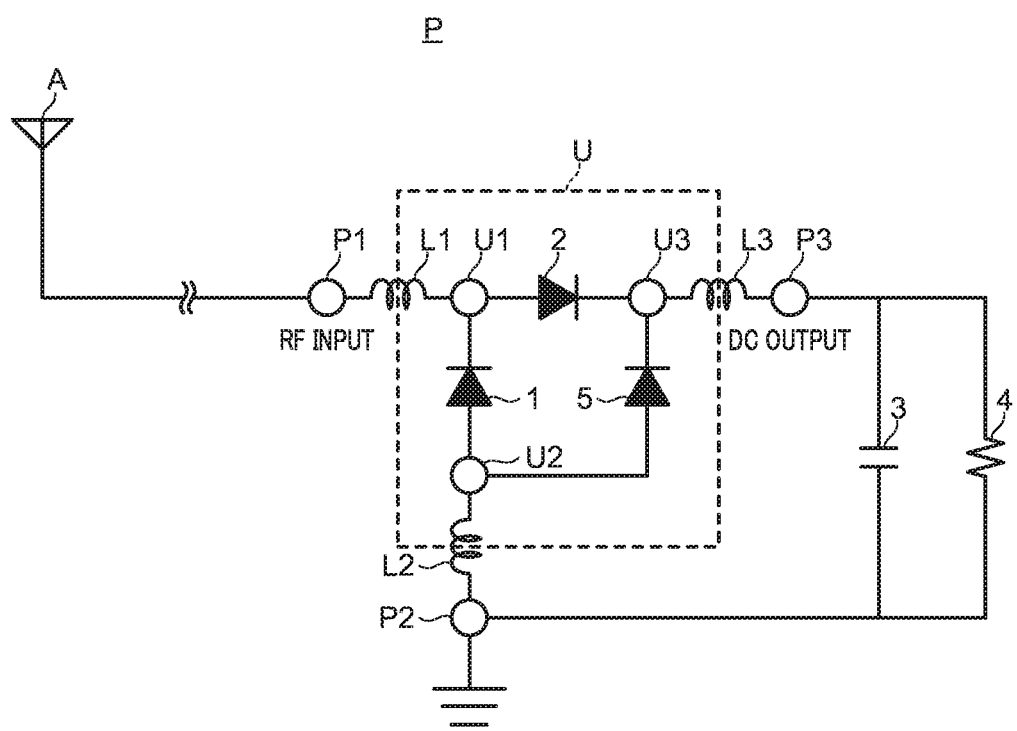
FIG. 2 is a diagram illustrating an example structure of a microwave rectifier circuit according to Embodiment 1.
Figure 3:
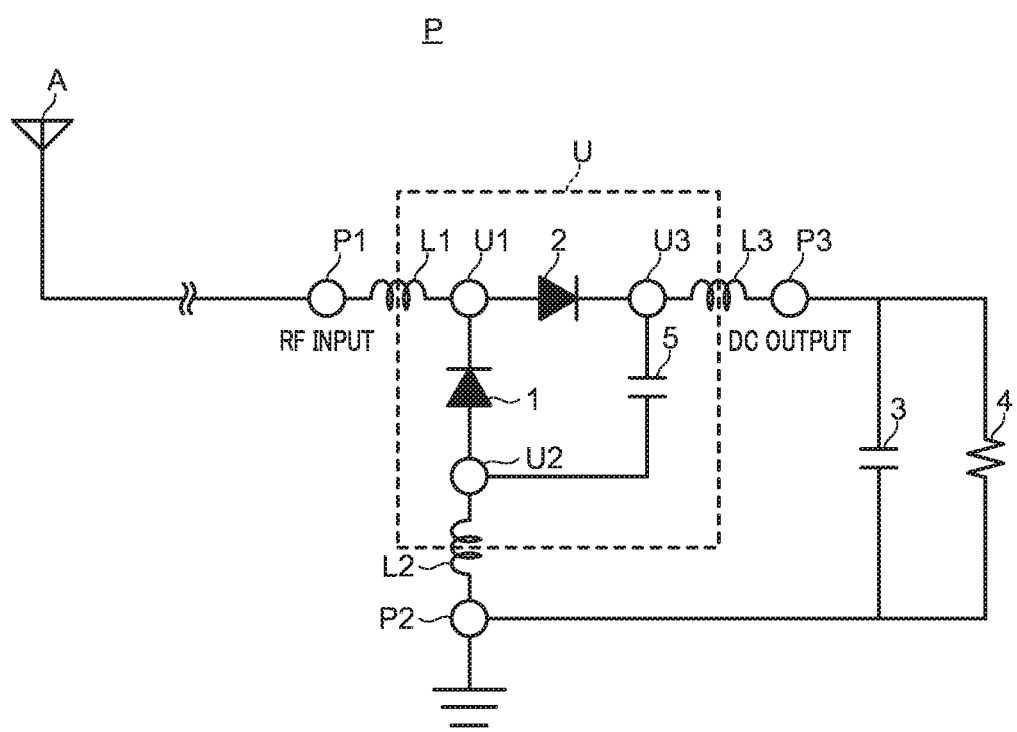
FIG. 3 is a diagram illustrating an equivalent circuit of the microwave rectifier circuit according to Embodiment 1.

FIG. 2 is a diagram illustrating an example structure of the microwave rectifier circuit according to the present embodiment. FIG. 3 is a diagram illustrating an equivalent circuit of the microwave rectifier circuit in FIG. 2.

The microwave rectifier circuit according to the present embodiment includes first SBD 1 (corresponding to "first Schottky diode" of the present invention), second SBD 2 (corresponding to "second Schottky diode" of the present invention), third SBD 5 (corresponding to "third Schottky diode" of the present invention), smoothing capacitor 3, and load resistor 4.

An area enclosed by a dotted line in FIG. 2 corresponds to a circuit region formed on semiconductor device U. As illustrated in FIG. 2, semiconductor device U includes input section U1 (in this case, input terminal U1) to which high-frequency power is input from outside, ground connection section U2 (in this case, GND terminal U2), and output section U3 (in this case, output terminal U3) that outputs rectified DC power.

The microwave rectifier circuit according to the present embodiment is different from the microwave rectifier circuit illustrated in FIG. 1 in that third SBD 5 (hereinafter, referred to as "capacitor SBD 5") forming a low-pass filter is formed at a later stage of a rectifier section formed from first SBD 1 (hereinafter, referred to as "first rectifier SBD 1") and second SBD (hereinafter, referred to as "second rectifier SBD 2").

First rectifier SBD 1 has a cathode connected to input terminal U1, and an anode connected to GND terminal U2. Second rectifier SBD 2 has a cathode connected to output terminal U3, and an anode connected to input terminal U1. First rectifier SBD 1 causes a current to flow to a later stage only when the high-frequency power input from input terminal U1 has a negative voltage with respect to GND terminal U2, and second rectifier SBD 2 causes a current to flow only when the high-frequency power input from input terminal U1 has a positive voltage with respect to output terminal U3, and the high-frequency power is rectified by causing a current to flow from GND terminal U3 to output terminal U2 at all times.

Smoothing capacitor 3 is disposed on an output side of output terminal U3 of semiconductor device U, and is to smooth power that is a pulsating current output from output terminal U3 of semiconductor device U.

Capacitor SBD 5 has a cathode connected to output terminal U3, and an anode connected to GND terminal U2. At a time of rectifying operation, a DC voltage of a reverse bias is constantly applied to capacitor SBD 5, and capacitor SBD 5 thereby functions as a capacitor (see FIG. 3). Furthermore, capacitor SBD 5 operates as a low-pass filter at a later stage of the rectifier section. Voltage fluctuations occurring between GND terminal U2 and output terminal U3 are thereby suppressed, and a voltage across terminals of first rectifier SBD 1 and a voltage across terminals of second rectifier SBD 2 are also stabilized.

As described above, semiconductor device U according to the present embodiment suppresses ripples occurring in a voltage that is generated across terminals of first rectifier SBD 1 and in a voltage that is generated across terminals of second rectifier SBD 2, by including capacitor SBD 5 that is embedded in a same chip together with first rectifier SBD 1 and second rectifier SBD 2.

Additionally, as smoothing capacitor 3, one with relatively large electrostatic capacitance according to an output voltage is used, and thus, smoothing capacitor 3 is normally attached on the printed circuit board. In other words, smoothing capacitor 3 is connected to semiconductor device U by wire-bondings L1 to L3, and thus, a voltage across terminals of first rectifier SBD 1 or of second rectifier SBD 2 cannot be stabilized by smoothing capacitor 3.

Generally, a metal-insulator-metal (MIM) capacitor which is formed by stacking metal and an insulating film is sometimes used as an on-chip capacitor. However, if an MIM capacitor is to be formed on a same semiconductor chip as a rectifier SBD, a process of forming the MIM capacitor has to be included separately from a process of forming the rectifier SBD, and there is a problem that a manufacturing process becomes complex.

In this respect, with semiconductor device U according to the present embodiment, capacitor SBD 5 is simultaneously formed in the process for forming first rectifier SBD 1 or second rectifier SBD 2 so as to simplify the manufacturing process.

<Structure of Semiconductor Device>

In the following, an example structure of semiconductor device U according to the present embodiment will be described with reference to FIGS. 4 to 6.

Figure 4:
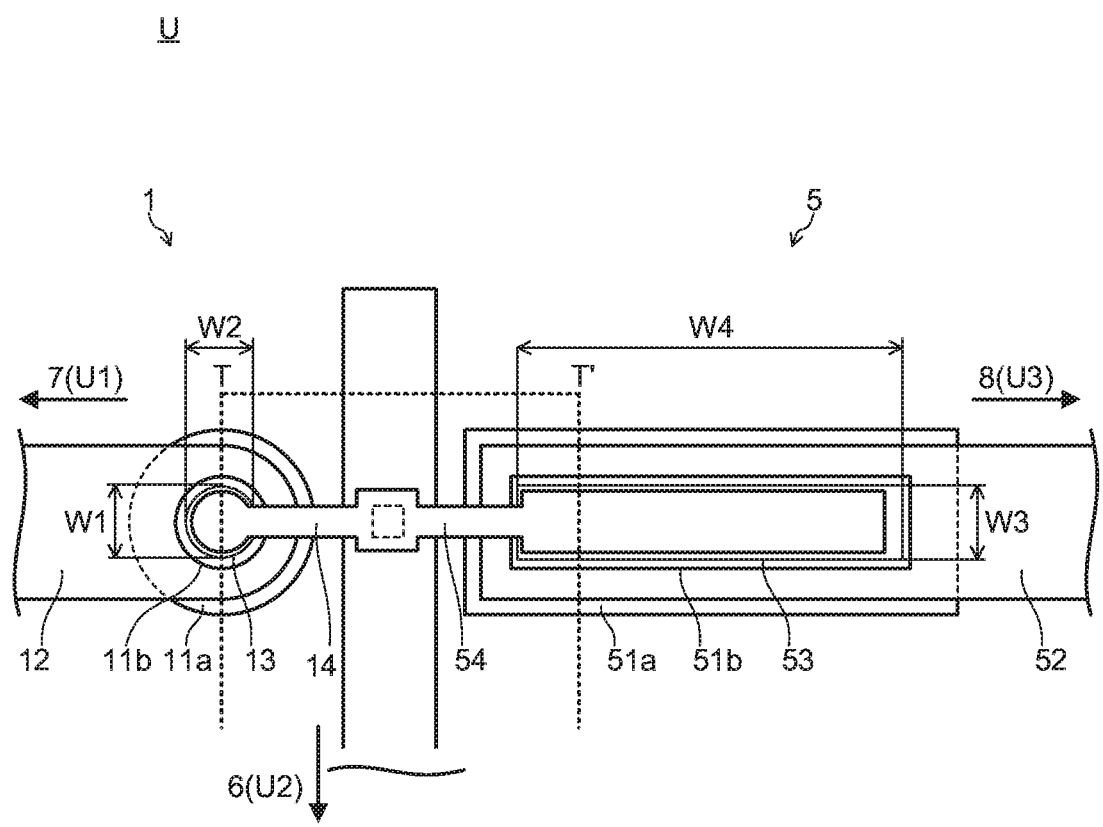
FIG. 4 is a diagram of a semiconductor device according to Embodiment 1 in planar view.
Figure 5:
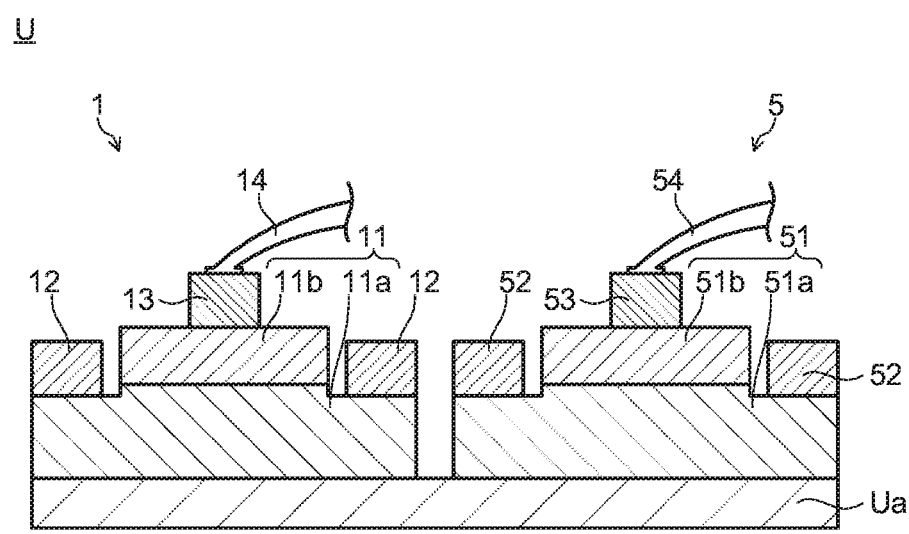
FIG. 5 is a diagram illustrating a cross-sectional structure of the semiconductor device according to Embodiment 1.

FIG. 4 is a diagram illustrating a planar structure, in planar view, of an SBD used in semiconductor device U according to the present embodiment. FIG. 5 is a diagram illustrating a cross-sectional structure of semiconductor device U according to the present embodiment. FIG. 5 illustrates a cross-sectional structure cut along line T-T' in FIG. 4. FIG. 6 is an overall view of the semiconductor device U according to the present embodiment in planar view.

Semiconductor device U according to the present embodiment includes, on same substrate Ua, first rectifier SBD 1, second rectifier SBD 2, and capacitor SBD 5.

First rectifier SBD 1, second rectifier SBD 2, and capacitor SBD 5 are each a lateral SBD where an anode electrode and a cathode electrode are formed on a main surface side of substrate Ua. Furthermore, first rectifier SBD 1, second rectifier SBD 2, and capacitor SBD 5 are formed, respectively, in a first region, a second region, and a third region on substrate Ua that are insulated and separated from one another.

Additionally, in the present embodiment, second rectifier SBD 2 (not illustrated in FIGS. 4 and 5) is assumed to have a same SBD structure as first rectifier SBD 1, and in the following, a collective term "rectifier SBD" will be used when not particularly distinguishing between the two, and a description will be given only of first rectifier SBD 1.

Rectifier SBD 1 includes semiconductor layer 11, cathode electrode 12, anode electrode 13, and lead-out wire 14. Capacitor SBD 5 includes semiconductor layer 51, cathode electrode 52, anode electrode 53, and lead-out wire 54.

Substrate Ua is more preferably an insulating substrate, and a sapphire substrate, a semi-insulating SiC substrate, a semi-insulating GaAs substrate, a high-resistance silicon substrate or the like is used therefor, for example.

Semiconductor layer 11 is formed by stacking access layer 11a and active layer 11b.

Access layer 11a is a semiconductor material that cathode electrode 12 comes into Ohmic contact with, and access layer 11a causes a current flowing from anode electrode 13 to flow to cathode electrode 12. For example, an n-type GaN-based semiconductor (such as GaN, GaInN, AlGaN, or AlGaInN) is used for access layer 11a. Preferably, to reduce access resistance of the SBD, access layer 11a is made of a low-resistance $n^+$-type GaN-based semiconductor with a sufficiently high donor concentration.

Active layer 11b is a semiconductor material that anode electrode 13 comes into Schottky contact with, and active layer 11b is made of an $n^-$-type GaN-based semiconductor with a donor concentration lower than that of access layer 11a, for example.

The semiconductor materials for access layer 11a and active layer 11b may be other than GaN, and GaAs, SiC, and Si may also be used, for example. However, from the standpoint of withstand voltage, on-resistance, frequency characteristics and the like, GaN is desirable as the semiconductor material for access layer 11a and active layer 11b. An upper part of access layer 11a and active layer 11b have a mesa shape such that active layer 11b becomes island-shaped in planar view (details will be given later).

Cathode electrode 12 is a metal that is capable of Ohmic contact with access layer 11a, and a laminate of a Ti layer and an Al layer is used therefor, for example.

Anode electrode 13 is a metal that is capable of Schottky contact with active layer 11b, and a laminate stacking, from a lower layer side that comes into contact with active layer 11b, a TiN layer, an adhesion layer (for example, Ni, Pd, Pt), and a resistance-reducing metal layer (for example, Au, Al) in the order presented is used therefor, for example.

Additionally, the materials for cathode electrode 12 and anode electrode 13 may be selected as appropriate from known materials, according to the underlying semiconductor material.

Lead-out wire 14 is wiring that connects anode electrode 13 and GND-connection pad electrode 6, and air-bridge wiring is used therefor, for example.

For example, semiconductor layer 51, cathode electrode 52, anode electrode 53, and lead-out wire 54 of capacitor SBD 5 are formed of same materials as semiconductor layer 11, cathode electrode 12, anode electrode 13, and lead-out wire 14 of rectifier SBD 1, respectively. Furthermore, semiconductor layer 51, cathode electrode 52, anode electrode 53, and lead-out wire 54 of capacitor SBD 5 are wholly or partly formed simultaneously in the processes of forming semiconductor layer 11, cathode electrode 12, anode electrode 13, and lead-out wire 14 of rectifier SBD 1. In other words, semiconductor layer 11 of rectifier SBD 1 and semiconductor layer 51 of capacitor SBD 5 corresponds to one region and another region on the semiconductor layer that are formed in the same process.

In the following, planar shapes of anode electrode 13 of first rectifier SBD 1, anode electrode 23 of second rectifier SBD 2, and anode electrode 53 of capacitor SBD 5 will be described with reference to FIG. 6. Additionally, in addition to structural elements of first rectifier SBD 1 and capacitor SBD 5, FIG. 6 also illustrates each structural element (semiconductor layer 21, cathode electrode 22, anode electrode 23, lead-out wire 24) of second rectifier SBD 2.

To function as a capacitor, capacitor SBD 5 is desirably formed such that electrostatic capacitance is increased. The electrostatic capacitance of capacitor SBD 5 is desirably about several tens of times depletion layer capacitance of first and second rectifier SBDs 1, 2, and more preferably, an area of anode electrode 53 of capacitor SBD 5 is at least ten times an area of anode electrode 13 of first rectifier SBD 1 (or anode electrode 23 of second rectifier SBD 2) in planar view.

On the other hand, to function as a rectifier element, rectifier SBDs 1, 2 desirably have small on-resistance, and small electrostatic capacitance at the time of being off. Furthermore, due to flow of an on-current, heat is generated at rectifier SBDs 1, 2 by parasitic resistance, and thus, rectifier SBDs 1, 2 desirably each have an electrode structure with good heat dissipation characteristics.

Figure 6:
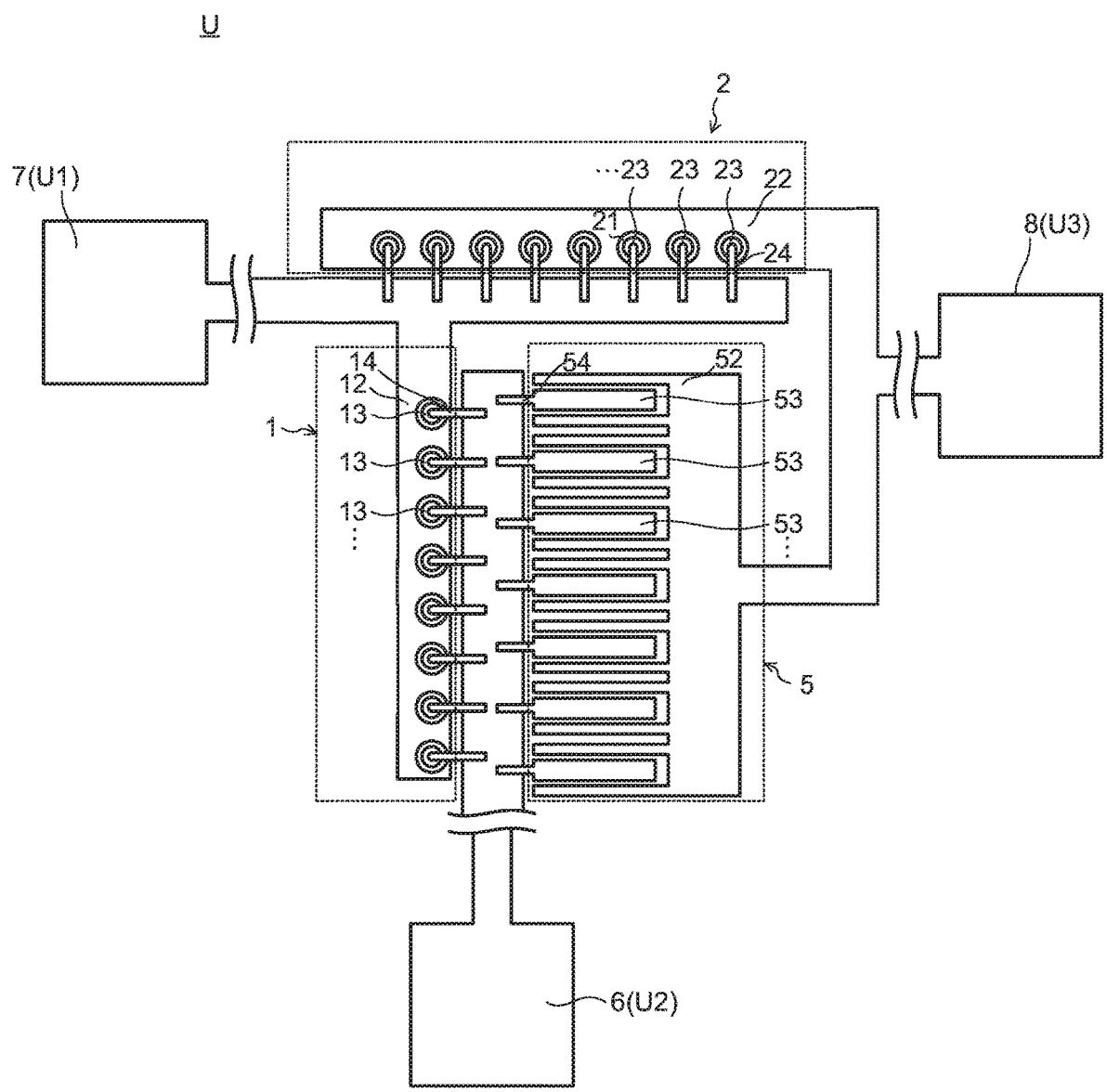
FIG. 6 is an overall view of the semiconductor device according to Embodiment 1 in planar view.

From such a standpoint, as illustrated in FIG. 6, with semiconductor device U according to the present embodiment, anode electrodes 13, 23 of rectifier SBDs 1, 2 each have a dot-shaped electrode structure, and anode electrode 53 of capacitor SBD 5 has a finger-shaped electrode structure. Additionally, the "dot-shaped electrode structure" means a structure where a plurality of anode electrodes 13, 23 divided into dots are surrounded by cathode electrodes 12, 22, respectively. Furthermore, the "finger-shaped electrode structure" means a structure where a plurality of linear anode electrodes 53 and linear cathode electrodes 52 are arrayed while facing each other.

More specifically, anode electrodes 13, 23 of rectifier SBDs 1, 2 are divided into a plurality of dot-shaped electrodes, and anode electrodes 13, 23 obtained by the division are surrounded by cathode electrodes 12, 22, respectively.

More preferably, a planar shape of each anode electrode 13, 23 of rectifier SBDs 1, 2 has a length-to-width ratio (in FIG. 4, W2/W1) of two or less. In other words, the planar shape of each anode electrode 13, 23 is a circle or a square. Furthermore, cathode electrode 12, 22 is provided to entirely surround corresponding anode electrode 13, 23. Circumferential lengths of anode electrodes 13, 23 are thereby increased, and access resistance, which is one factor of on-resistance of rectifier SBDs 1, 2, is reduced.

For its part, anode electrode 53 of capacitor SBD 5 is divided into a plurality of rectangular electrodes, and cathode electrode 52 is disposed between divided anode electrodes 53.

More preferably, a planar shape of each anode electrode 53 of capacitor SBD 5 has a length-to-width ratio (in FIG. 4, W4/W3) that is greater than five. In other words, the planar shape of each anode electrode 53 is a narrow and long linear shape, and is a rectangle, for example. Cathode electrodes 52 are disposed at least along a lengthwise direction of anode electrode 53 with anode electrode 53 in between from opposite sides.

Large electrostatic capacitance may thereby be secured for capacitor SBD 5. More specifically, at a high frequency, electrostatic capacitance is not valid at a position where a distance between anode electrode 53 and cathode electrode 52 is great (such as a center position of anode electrode 53). With respect to this point, by causing the planar shape of anode electrode 53 to be a finger-shape, electrostatic capacitance may be maximized without increasing parasitic resistance of capacitor SBD 5. Additionally, only a small amount of AC current flows through capacitor SBD 5, and no heat is generated, and thus, capacitor SBD 5 does not have to be dot-shaped to achieve heat dissipation characteristics.

Furthermore, GND-connection pad electrode 6, input pad electrode 7, and output pad electrode 8 are disposed on substrate Ua of semiconductor device U.

GND-connection pad electrode 6 forms GND terminal U2 (see FIG. 2), and is connected to external terminal P2 by wire-bonding L2. GND-connection pad electrode 6 is connected to anode electrode 13 of rectifier SBD 1 through lead-out wire 14, and connects anode electrode 13 to ground. Furthermore, GND-connection pad electrode 6 is connected to anode electrode 53 of capacitor SBD 5 through lead-out wire 54, and connects anode electrode 53 to ground.

Moreover, input pad electrode 7 forms input terminal U1 (see FIG. 2), and is connected to external terminal P1 by wire-bonding L1. Cathode electrode 13 of first rectifier SBD 1 is directly connected to input pad electrode 7, and anode electrode 23 of second rectifier SBD 2 is connected to input pad electrode 7 through routing wire 24.

Furthermore, output pad electrode 8 forms output terminal U3 (see FIG. 2), and is connected to external terminal P3 by wire-bonding L3. Cathode electrode 53 of capacitor SBD 5 and cathode electrode of second rectifier SBD 2 are directly connected to output pad electrode 8.

GND-connection pad electrode 6, input pad electrode 7, and output pad electrode 8 described above are each a laminate of a Ti layer and an Al layer, for example, and are simultaneously formed at the time of forming cathode electrode 12 of rectifier SBD 1.

Additionally, a mode of wiring connecting each terminal and each electrode described above may be any mode, and air-bridge wiring or the like does not necessarily have to be used.

Moreover, antenna A may also be formed in semiconductor device U (described later with reference to FIG. 17), and in such a case, input terminal U1 is not connected to an external terminal, and input pad electrode 7 is thus unnecessary. In such a case, wiring of antenna A forms input terminal U1.

<Manufacturing Process of Semiconductor Device>

Next, a manufacturing process of semiconductor device U according to the present embodiment will be described with reference to FIG. 7.

FIGS. 7A to 7F are diagrams illustrating, in a chronological order, an example of a manufacturing process of semiconductor device U according to the present embodiment. Additionally, second rectifier SBD 2 is omitted in FIGS. 7A to 7F, but second rectifier SBD 2 according to the present embodiment is formed simultaneously as first rectifier SBD 1.

Figure 7A:
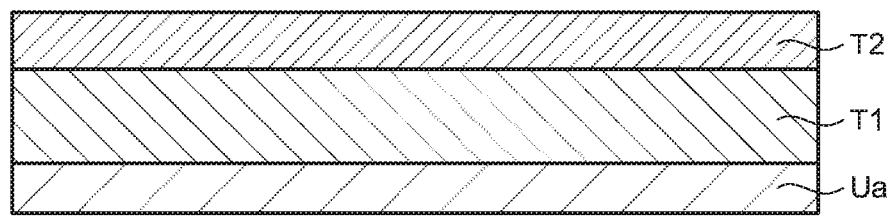
FIGS. 7A, 7B, 7C, 7D, 7E and 7F are diagrams illustrating, in a chronological order, an example of a manufacturing process of the semiconductor device according to Embodiment 1.

FIG. 7A illustrates a step of forming semiconductor layers T1, T2. In this step, semiconductor layer T1 that is doped in high concentration and semiconductor layer T2 that is doped in low concentration are sequentially epitaxially grown on substrate Ua. At this time, as an epitaxial growth method, a metal organic chemical vapor deposition (MOCVD) method or a molecular beam epitaxy (MBE) method may be used, for example.

Figure 7B:
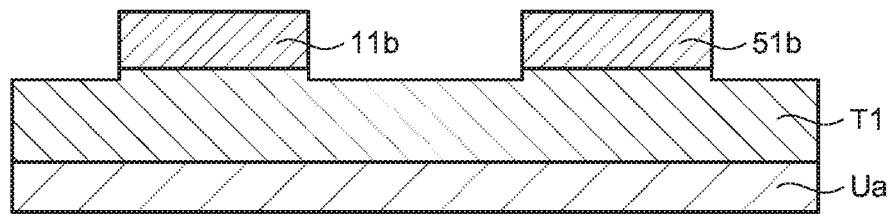

FIG. 7B illustrates a step of forming active layers 11b, 51b. In this step, first, a resist pattern (not illustrated) by which regions of active layers 11b, 51b are masked is formed by lithography. Then, by performing dry etching using the resist pattern as a mask, active layers 11b, 51b and top portions of access layers 11a, 51a are patterned into a mesa shape. At this time, as the dry etching, inductively coupled plasma (ICP) etching that uses $SiCl_4$ gas is used, for example. Then, the resist pattern is removed.

Figure 7C:
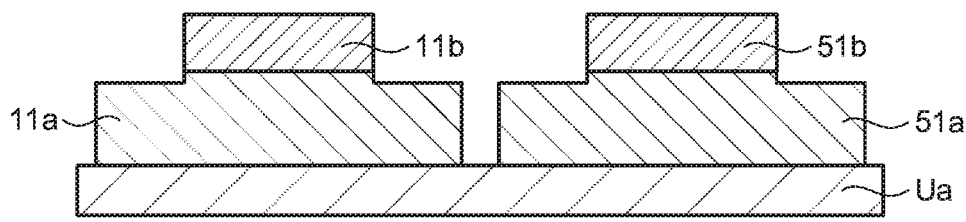

FIG. 7C illustrates a step of forming access layers 11a, 51a. In this step, first, a resist pattern (not illustrated) by which regions of access layers 11a, 51a are masked is formed by lithography. Then, by performing dry etching using the resist pattern as a mask, semiconductor layer T1 is patterned, rectifier SBD 1 and capacitor SBD 5 are separated into elements, and access layer 11a and access layer 51a are formed. Then, the resist pattern is removed.

Figure 7D:
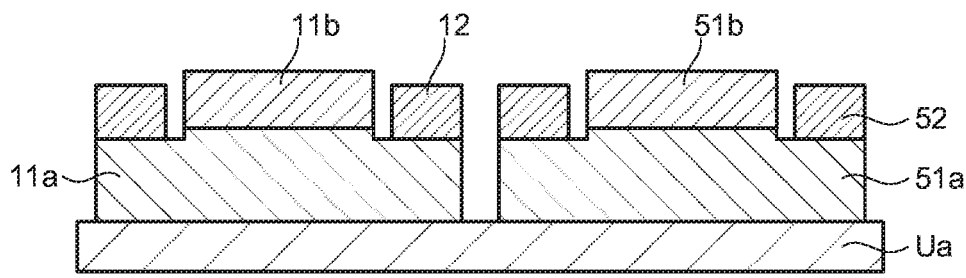

FIG. 7D illustrates a step of forming cathode electrodes 12, 52. In this step, first, a resist pattern (not illustrated) having a predetermined shape that is open at parts corresponding to formation parts for cathode electrodes 12, 52 and at a part corresponding to a formation part for GND-connection pad electrode 6 is formed by lithography, and then, a metal film is stacked by a sputtering method or the like on an entire surface. Next, the resist pattern and the metal film that is stacked thereon are removed by a lift-off method.

Figure 7E:
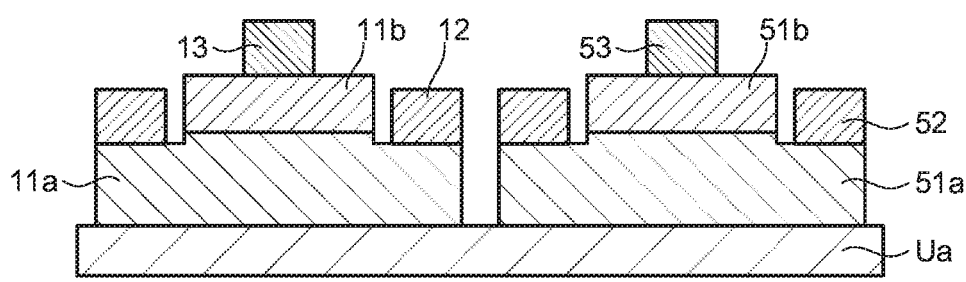

FIG. 7E illustrates a step of forming anode electrodes 13, 53. In this step, first, a resist pattern (not illustrated) having a predetermined planar shape that is open at parts corresponding to center parts of active layers 11b, 51b is formed by lithography, and then, TiN, metal for forming an adhesion layer, and metal for forming a resistance-reducing metal layer are sequentially stacked on an entire surface without being exposed to air in mid-course. At this time, reactive sputtering may be used, for example. A resist pattern is further formed on the metal layer, and electroplating of gold, copper or the like with the metal layer as an electrode is applied. Gold or copper is stacked only on parts where there is no upper-layer resist pattern. Next, the resist pattern described above and the underlying resist pattern are removed together with the TiN layer, the adhesion layer, and the resistance-reducing metal layer that are stacked on top. Anode electrodes 13, 53 and lead-out wires 14, 54 formed from the TiN layer, the adhesion layer, and the resistance-reducing metal layer are thereby formed on active layers 11b, 51b.

Figure 7F:
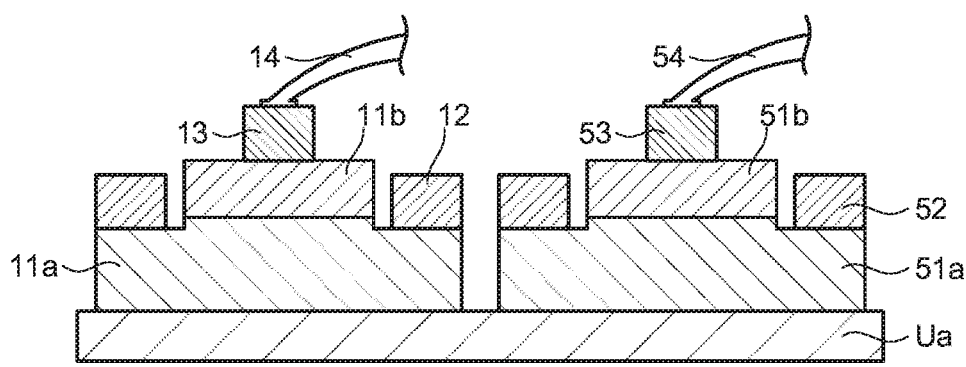

FIG. 7F illustrates a state where lead-out wires 14, 54 are formed. Lead-out wires 14, 54 connect anode electrodes 13, 53 to GND-connection pad electrode 6.

Semiconductor device U according to the present embodiment may be manufactured by the steps as described above.

<Operation Test of Semiconductor Device>

In the following, results of performing circuit simulation for operation test of semiconductor device U according to the present embodiment are described with reference to FIGS. 8A and 8B, FIGS. 9A and 9B, and FIGS. 10A and 10B.

Figure 1:
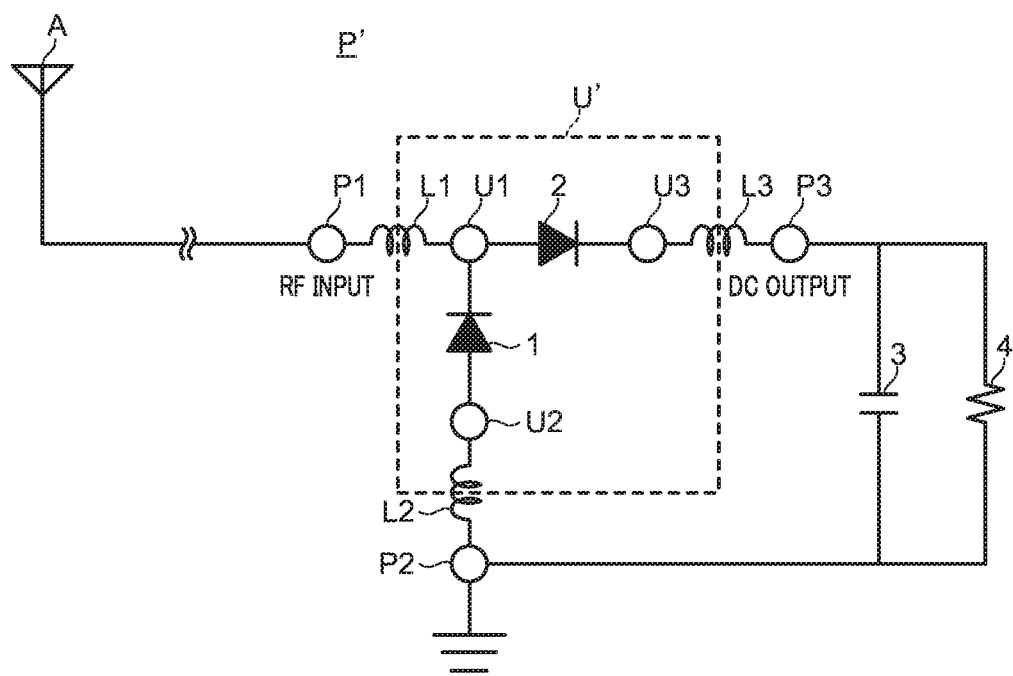
FIG. 1 is a diagram illustrating an example of a microwave rectifier circuit according to a conventional technique.
Figure 8A:
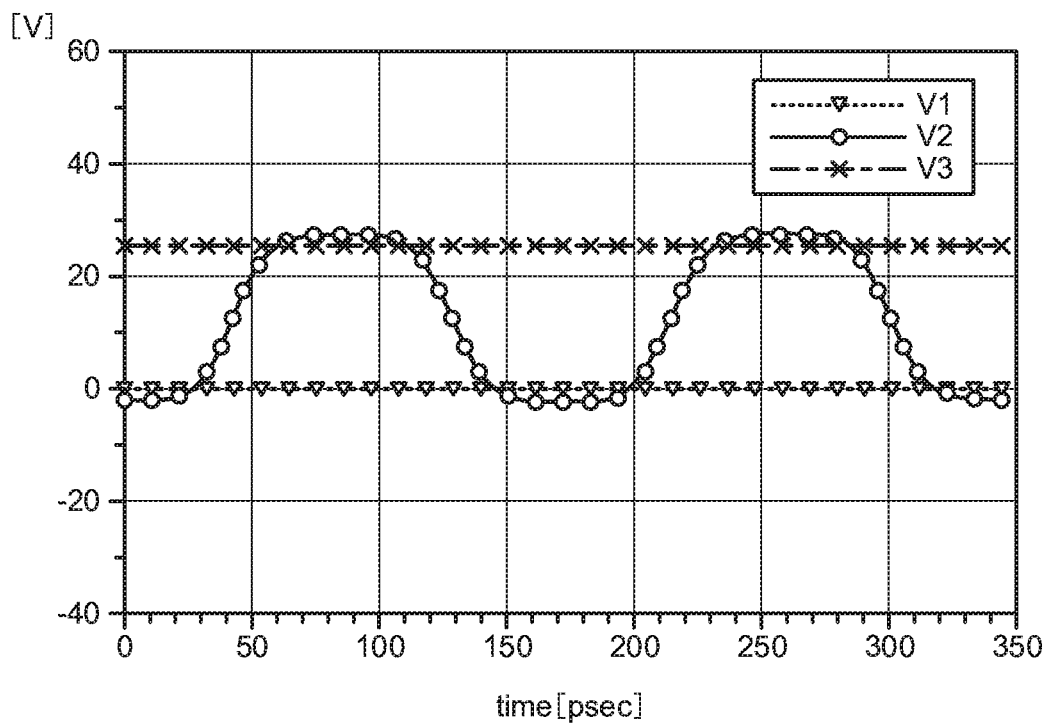
FIGS. 8A and 8B are voltage waveform diagrams desired to be obtained for each part of the present semiconductor device in an ideal state where parasitic inductance is zero.
Figure 8B:
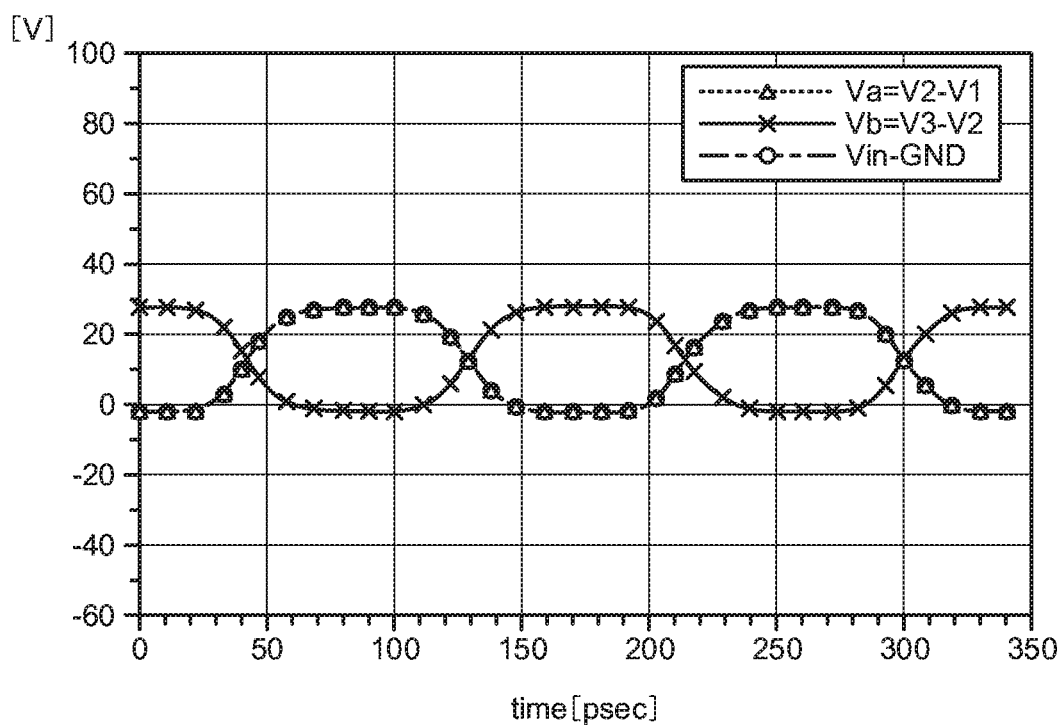

FIGS. 8A and 8B are voltage waveforms desired to be measured for each part of semiconductor device U' illustrated in FIG. 1, in the case of an ideal state where parasitic inductance of each wire-bonding L1, L2, L3 is zero.

Figure 9A:
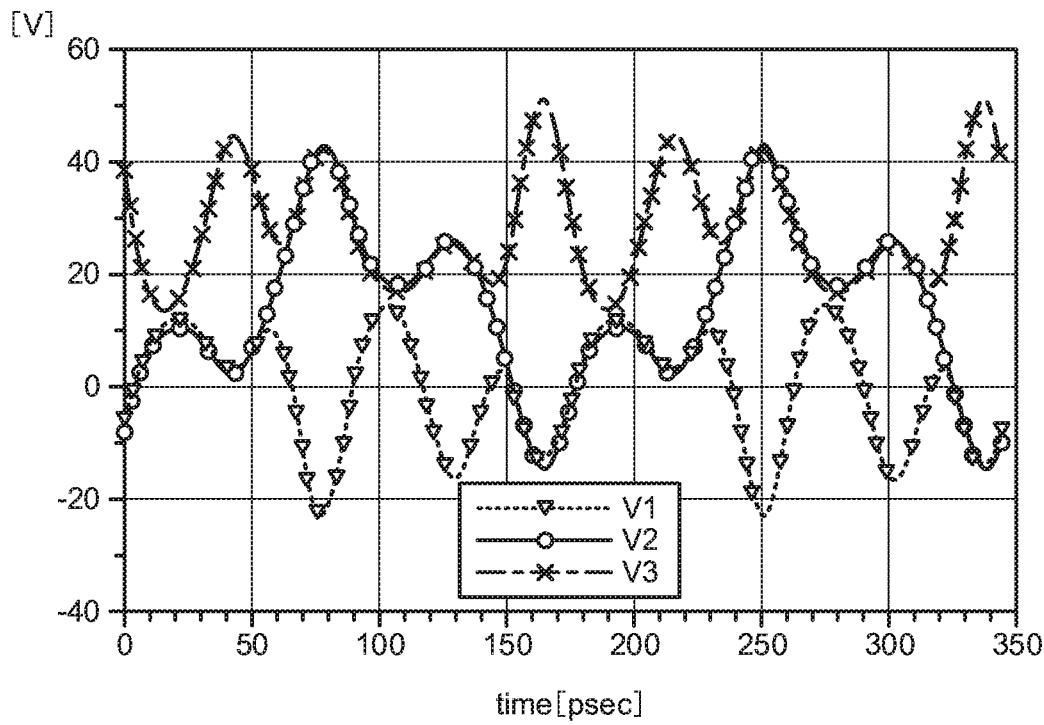
FIGS. 9A and 9B are voltage waveform diagrams measured for each part of a semiconductor device according to the conventional technique.
Figure 9B:
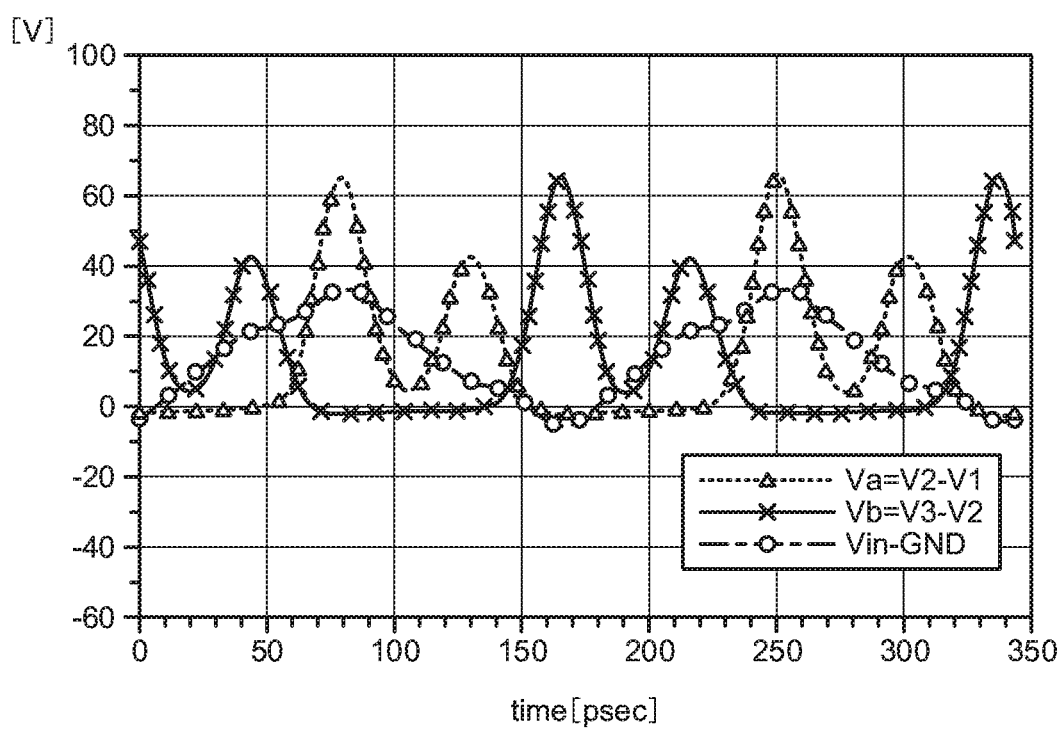

FIGS. 9A and 9B are voltage waveforms measured for each part of semiconductor device U' according to the conventional technique illustrated in FIG. 1, in a case where parasitic inductance of each wire-bonding L1, L2, L3 is 2 nH.

Figure 10A:
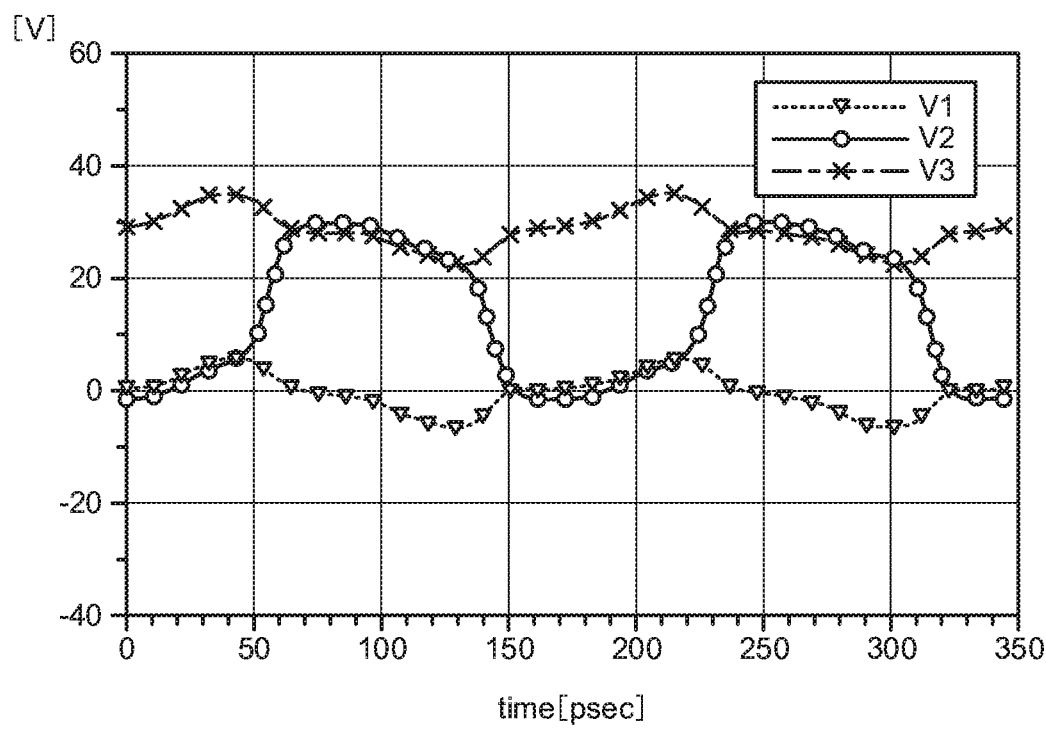
FIGS. 10A and 10B are voltage waveform diagrams measured for each part of the semiconductor device according to Embodiment 1.
Figure 10B:
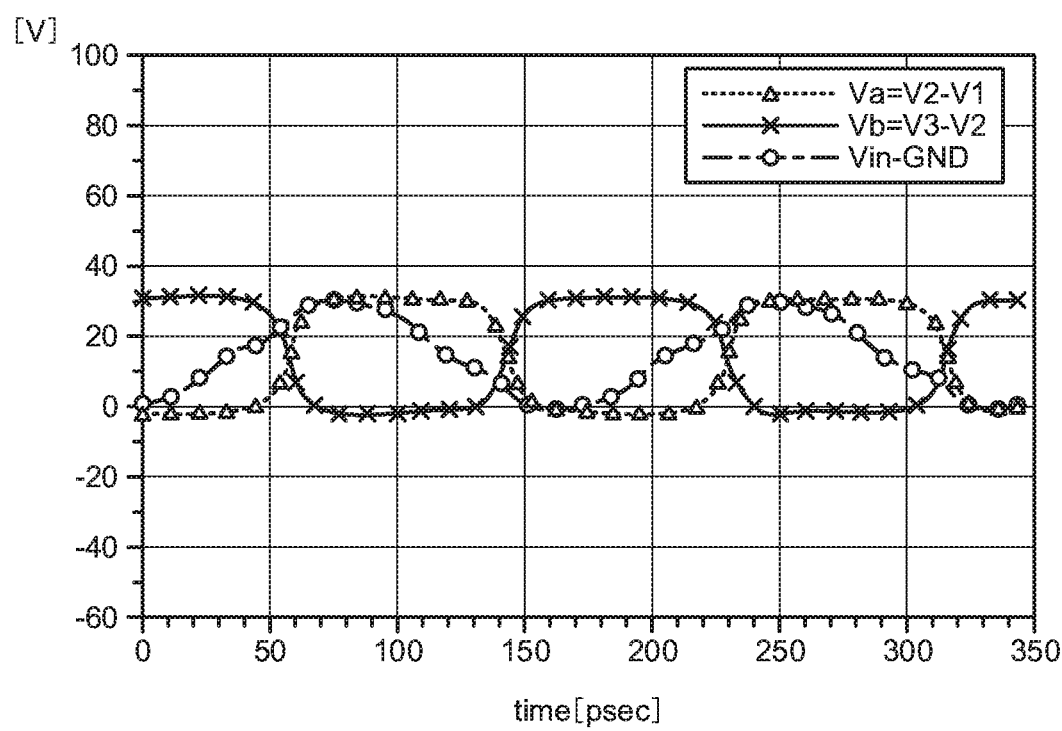

FIGS. 10A and 10B are voltage waveforms measured for each part of semiconductor device U according to the present embodiment illustrated in FIG. 2, in a case where parasitic inductance of each wire-bonding L1, L2, L3 is 2 nH.

As described below, each graph in FIGS. 8A, 9A, and 10A shows potential of each terminal of semiconductor device U.

Dotted line V1: potential of GND terminal U2
Solid line V2: potential of input terminal U1
Dash-dotted line V3: potential of output terminal U3

As described below, each graph in FIGS. 8B, 9B, and 10B shows a voltage that is applied across terminals of first rectifier SBD 1 and the like of semiconductor device U.

Dash-dotted line Vin-GND: voltage of AC power that is input
Dotted line Va: voltage (Va=V2−V1) that is applied across terminals of first rectifier SBD 1
Solid line Vb: voltage (Vb=V3−V2) that is applied across terminals of second rectifier SBD 2

In the circuit simulation, a value that is measured at each part when high-frequency AC power (frequency: 5.8 GHz, effective power: 1 W) is input to input terminal U1 is calculated. Additionally, the circuit simulation is performed under conditions where load resistor 4 is 1 kΩ, and the area of anode electrode 53 of capacitor SBD 5 is 30 times the area of anode electrode 13 of rectifier SBD 1.

As illustrated in FIG. 8B (dotted line Va), in the case where the parasitic inductance is zero, the voltage that is applied across terminals of first rectifier SBD 1 is suppressed to about 30 V or less, also for semiconductor device U' according to the conventional technique.

On the other hand, as illustrated in FIG. 9B (dotted line Va, solid line Vb), with semiconductor device U' according to the conventional technique, in the case where there is parasitic inductance, large ripples are caused in both the voltage that is applied across terminals of first rectifier SBD 1 and the voltage that is applied across terminals of second rectifier SBD 2. Furthermore, a voltage that exceeds 60 V at its highest is generated as the voltage that is applied across terminals of first rectifier SBD 1, and as the voltage that is applied across terminals of second rectifier SBD 2, and there is a possibility that the SBDs are destroyed.

On the other hand, as illustrated in FIG. 10B (dotted line Va, solid line Vb), with semiconductor device U according to the present embodiment, although the voltage that is applied across terminals of first rectifier SBD 1 and the voltage that is applied across terminals of second rectifier SBD 2 both fluctuate, the voltages are in synchronization with the potential of each terminal U1, . . . , U3. That is, with semiconductor device U according to the present embodiment, the voltage that is applied across terminals of first rectifier SBD 1 and the voltage that is applied across terminals of second rectifier SBD 2 are suppressed to substantially same values as in the case as illustrated in FIG. 8B (dotted line Va, solid line Vb) where the parasitic inductance is zero, and are stable.

As described above, with semiconductor device U according to the present embodiment, at the time of forming first and second rectifier SBDs 1, 2, capacitor SBD 5 may also be formed simultaneously. Accordingly, with semiconductor device U according to the present embodiment, a structure for stabilizing the voltages to be applied across terminals of first and second rectifier SBDs 1, 2 may be embedded in the semiconductor chip, without increasing the manufacturing processes. Because rectifying operation of first and second rectifier SBDs 1, 2 may be stabilized by such a structure, the conversion efficiency of power conversion may be increased.

Embodiment 2

Next, semiconductor device U according to Embodiment 2 will be described with reference to FIG. 11, and FIGS. 12A and 12B.

Figure 11:
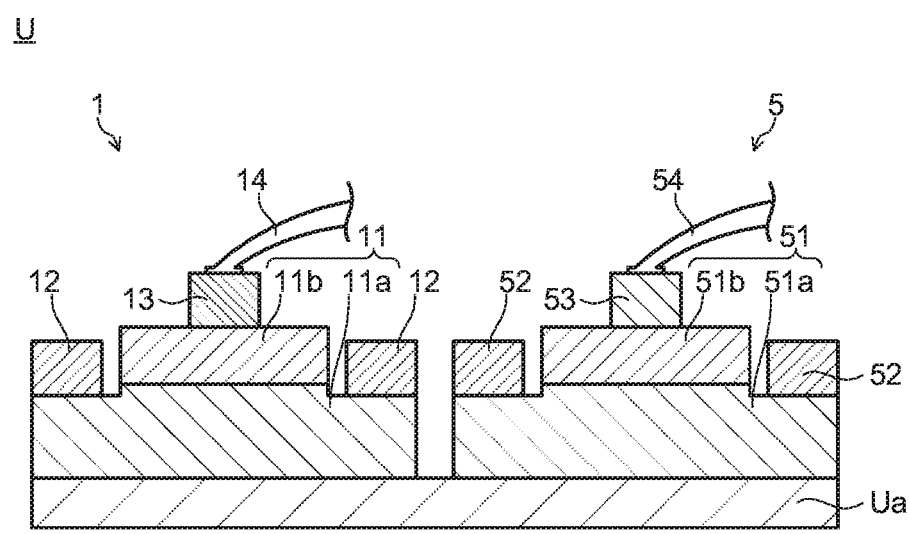
FIG. 11 is a diagram illustrating a cross-sectional structure of a semiconductor device according to Embodiment 2.

FIG. 11 is a diagram illustrating an example of a cross-sectional structure of semiconductor device U according to the present embodiment. Additionally, FIG. 11 corresponds to FIG. 5 in Embodiment 1.

Semiconductor device U according to the present embodiment is different from semiconductor device U according to Embodiment 1 in that a metal material having a larger work function than Schottky contact metal of anode electrode 13 of rectifier SBD 1 is used as Schottky contact metal of anode electrode 53 of capacitor SBD 5. A description of structures that are common to those in Embodiment 1 will be omitted (the same applies to subsequent embodiments).

Normally, to set a low forward voltage for rectifier SBD 1, a metal material with which a leakage current tends to occur in reverse bias is used as the Schottky contact metal of rectifier SBD 1. For its part, anode electrode 53 of capacitor SBD 5 is formed to have a large area to secure electrostatic capacitance of capacitor SBD 5, and thus, at the time of reverse bias, a great power loss may occur due to the leakage current. Additionally, normally, when semiconductor device U is performing rectifying operation, capacitor SBD 5 is used in a state where a rectified DC voltage is applied as a reverse bias.

From such a standpoint, a metal material having a larger work function than Schottky contact metal of anode electrode 13 of rectifier SBD 1 is used as the Schottky contact metal of anode electrode 53 of capacitor SBD 5 according to the present embodiment. A leakage current at capacitor SBD 5 may thereby be reduced.

Specifically, for example, in the case where Ni is used as the Schottky contact metal of rectifier SBD 1, Pt having a larger work function than Ni is used as the Schottky contact metal of capacitor SBD 5. Moreover, in the case where TiN is used as the Schottky contact metal of rectifier SBD 1, Ni having a larger work function than TiN is used as the Schottky contact metal of capacitor SBD 5.

To separately make anode metal, metal having a large work function is stacked, using a lift-off method, on anode electrode 53 part that tolerates large parasitic capacitance, in the step of forming anode electrodes 13, 53. At this time, the size of the electrode is made large taking into account misalignment in the next step. Next, anode electrodes 13, 53 are formed using an electrode material having a small work function. A Schottky barrier is thus formed for anode electrode 53, using metal having a large work function.

Additionally, a metal material of Schottky contact metal suitable for each of rectifier SBD 1 and capacitor SBD 5 is different depending on underlying semiconductor layer 11, 51 and required specifications, and thus, the metal material may be selected as appropriate according to underlying semiconductor layer 11, 51 and the required specifications.

Figure 12A:
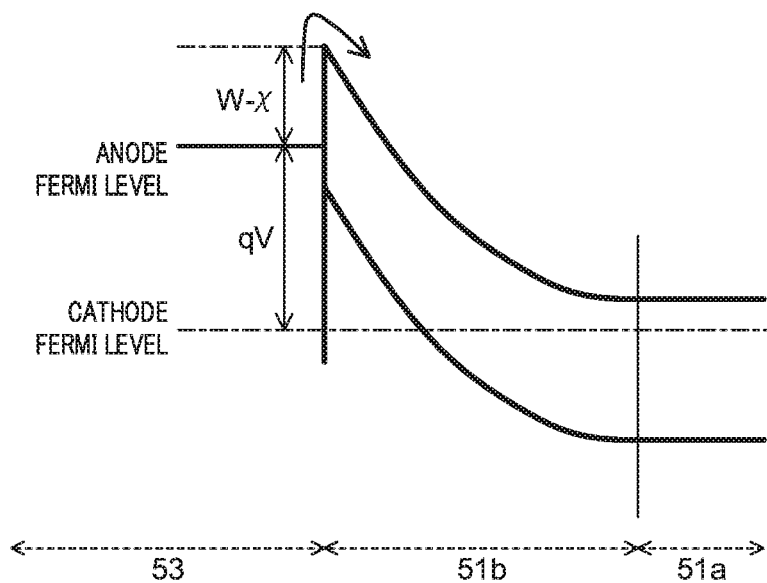
FIGS. 12A and 12B are energy band diagrams illustrating a Schottky barrier formed in an SBD of the semiconductor device according to Embodiment 2, at a contact region between an anode electrode and a semiconductor layer.
Figure 12B:
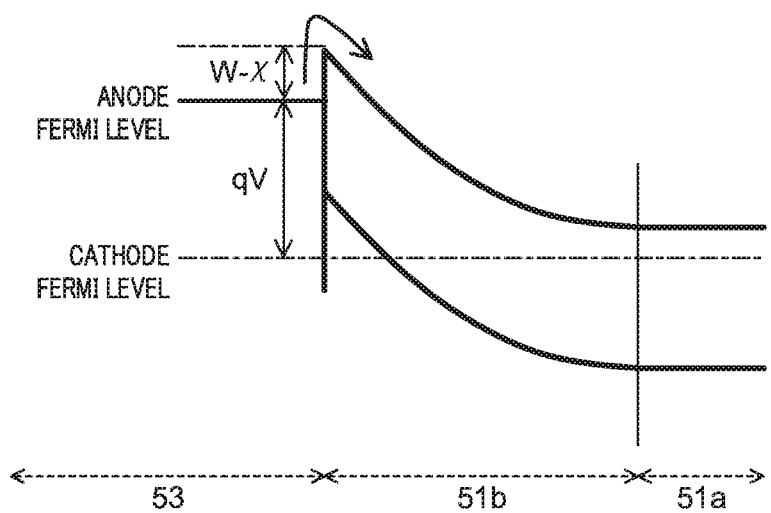

FIG. 12A is an energy band diagram illustrating a Schottky barrier formed at a contact region between anode electrode 53 and semiconductor layer 51 of capacitor SBD 5, and FIG. 12B is an energy band diagram illustrating a Schottky barrier formed at a contact region between anode electrode 13 and semiconductor layer 11 of rectifier SBD 1.

The energy band diagrams in FIGS. 12A and 12B illustrate states where same reverse bias is applied, and the Schottky barrier illustrated in FIG. 12A is higher than the Schottky barrier illustrated in FIG. 12B.

Generally, Schottky barrier $\varphi_B$ of an anode electrode of an SBD is expressed by difference $W-\chi$ between work function $W$ of Schottky contact metal and electron affinity $\chi$ of a semiconductor layer (n-type semiconductor layer) that comes into Schottky contact with the Schottky contact metal. At the time of reverse bias, an energy barrier that is formed in the anode electrode of the SBD is $W-\chi+qV[eV]$, taking reverse bias V into consideration.

A leakage current that flows at the time of reverse bias is caused by electrons flowing into the semiconductor layer over the energy barrier by a tunnel phenomenon or the like. Accordingly, the leakage current may be reduced by increasing a height of the Schottky barrier of the SBD.

Additionally, generally, the leakage current of the SBD at the time of reverse bias may be expressed by the following Expression (1).

$$J=AT^2\exp(-\varphi_B/kT) \quad \text{Expression (1)}$$

(where J is leakage current [A], A is Richardson constant, $\varphi_B$ is Schottky barrier $(=W-\chi)[eV]$, k is Boltzmann constant, and T is temperature [K])

A leakage current of capacitor SBD 5 where Schottky barrier $\varphi_B$ of the Schottky contact metal of capacitor SBD 5 is about 0.2 eV, for example, is calculated using Expression (1). At this time, even if the area of anode electrode 53 of capacitor SBD 5 is about 100 times the area of anode electrode 13 of rectifier SBD 1, an increase in the leakage current of capacitor SBD 5 may be suppressed to about 0.5% relative to the leakage current of anode electrode 13 of rectifier SBD 1.

As described above, with semiconductor device U according to the present embodiment, the leakage current at capacitor SBD 5 may be reduced, and a power loss at capacitor SBD 5 may be prevented.

Embodiment 3

In the following, semiconductor device U according to Embodiment 3 will be described with reference to FIGS. 13 and 14.

Figure 13:
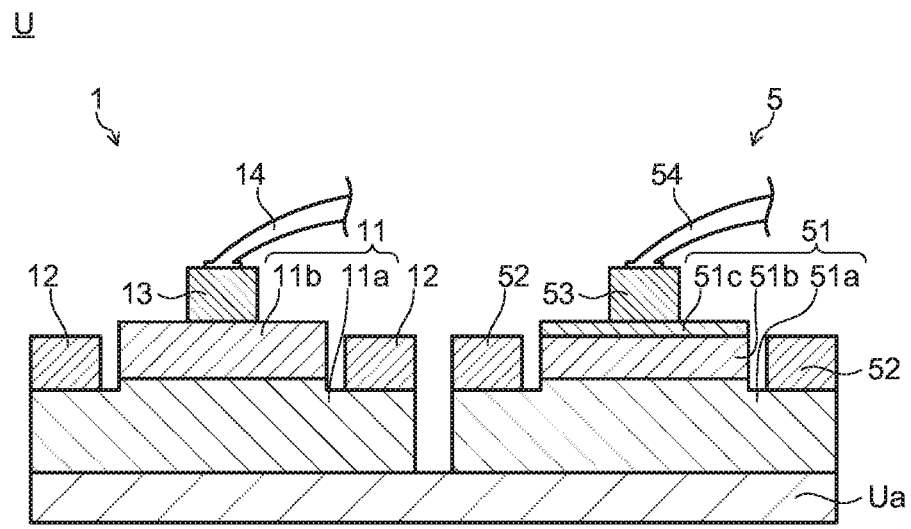
FIG. 13 is a diagram illustrating a cross-sectional structure of a semiconductor device according to Embodiment 3.

FIG. 13 is a diagram illustrating an example of a cross-sectional structure of semiconductor device U according to the present embodiment. Additionally, FIG. 13 corresponds to FIG. 5 in Embodiment 1.

Semiconductor device U according to the present embodiment is different from semiconductor device U according to Embodiment 1 with respect to the structure of semiconductor layer 51 that anode electrode 53 of capacitor SBD 5 is in contact with. Semiconductor layer 51 according to the present embodiment includes, in the contact region, low-concentration layer 51c with doping concentration lower than that of active layers 11b, 51b.

As described in Embodiment 2, a great power loss may be caused at capacitor SBD 5 due to a leakage current. From such a standpoint, capacitor SBD 5 according to the present embodiment has thin-film low-concentration layer 51c interposed between anode electrode 53 and active layer 51b.

Additionally, as the method of forming low-concentration layer 51c, a known epitaxial growth method may be used, as in the case of the process for forming active layers 11b, 51b, for example.

Figure 14:
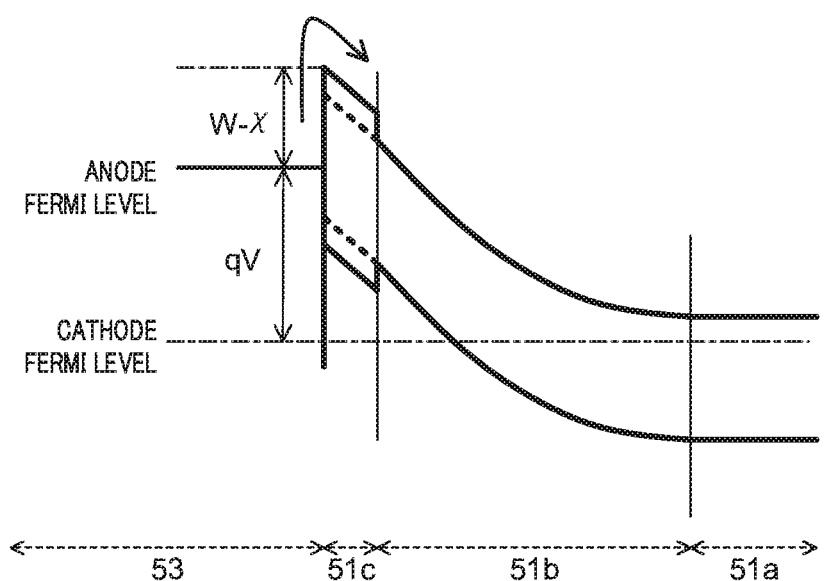
FIG. 14 is an energy band diagram illustrating a Schottky barrier formed in a capacitor SBD of the semiconductor device according to Embodiment 3, at a contact region between an anode electrode and a semiconductor layer.

FIG. 14 is an energy band diagram illustrating a Schottky barrier formed in capacitor SBD 5 according to the present embodiment, at a contact region between anode electrode 53 and semiconductor layer 51.

As illustrated in FIG. 14, when low-concentration layer 51c is interposed between anode electrode 53 and active layer 51b, the height of the Schottky barrier formed in the region is increased. In other words, the Schottky barrier formed in the contact region between anode electrode 53 and semiconductor layer 51 of capacitor SBD 5 is higher than the Schottky barrier formed in the contact region between anode electrode 13 and semiconductor layer 11 of rectifier SBD 1. The leakage current at capacitor SBD 5 may thereby be reduced.

In the manufacturing, before a Schottky electrode is formed, low-concentration layer 51c at the part of anode electrode 13 is partially removed by ICP etching or the like by using lithography.

As described above, with semiconductor device U according to the present embodiment, a power loss at capacitor SBD 5 may be prevented.

Modification 1 of Embodiment 3

An opposite conductivity-type layer that is doped to opposite conductivity type (p-type) may be interposed instead of low-concentration layer 51c according to Embodiment 3. In this case, the leakage current at capacitor SBD 5 may be further reduced.

Modification 2 of Embodiment 3

A wide band gap layer may be interposed instead of low-concentration layer 51c according to Embodiment 3. In this case, even when the Schottky contact metal of anode electrode 53 is the same, the leakage current may be reduced by the amount of increase in the Schottky barrier in a conduction band.

Additionally, in the case where GaN is used as active layer 51b, AlGaN is desirably used as the wide band gap layer. AlGaN may be formed continuously to a process of forming GaN as active layer 51b. Additionally, if Al is contained in GaN by about 10%, the Schottky barrier is increased by 0.22 eV, and the leakage current may be reduced by about 1/5000. These manufacturing methods are the same as those in Embodiment 3.

Embodiment 4

In the following, semiconductor device U according to Embodiment 4 will be described with reference to FIGS. 15 and 16.

Figure 15:
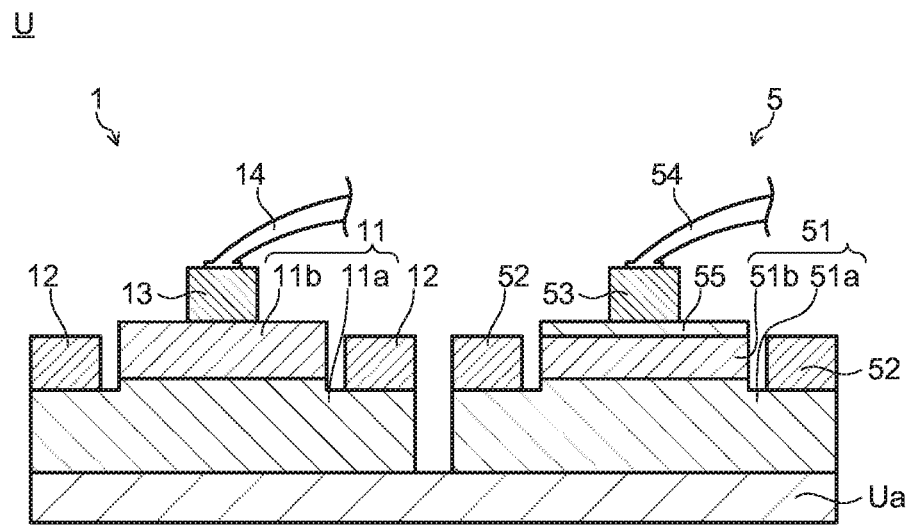
FIG. 15 is a diagram illustrating a cross-sectional structure of a semiconductor device according to Embodiment 4.

FIG. 15 is a diagram illustrating an example of a cross-sectional structure of semiconductor device U according to the present embodiment. Additionally, FIG. 15 corresponds to FIG. 5 in Embodiment 1.

Semiconductor device U according to the present embodiment is different from semiconductor device U according to Embodiment 1 with respect to a contact structure of anode electrode 53 and semiconductor layer 51 of capacitor SBD 5. Capacitor SBD 5 according to the present embodiment includes thin-film insulating layer 55 at a contact region where anode electrode 53 contacts semiconductor layer 51.

As insulating layer 55, an insulating film of $SiO_2$ or $Si_3N_4$ having a film thickness of 10 nm or less may be used, for example. As the method of forming insulating layer 55, a known CVD method may be used, for example.

Figure 16:
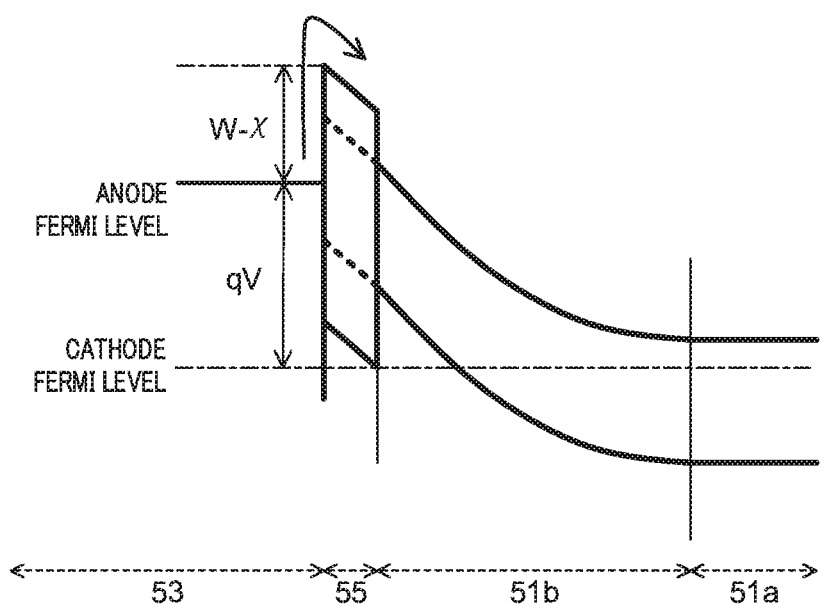
FIG. 16 is an energy band diagram illustrating a Schottky barrier formed in a capacitor SBD of the semiconductor device according to Embodiment 4, at a contact region between an anode electrode and a semiconductor layer.

FIG. 16 is an energy band diagram illustrating a Schottky barrier formed in capacitor SBD 5 according to the present embodiment, at a contact region between anode electrode 53 and semiconductor layer 51.

As illustrated in FIG. 16, when thin-film insulating layer 55 is interposed between anode electrode 53 and active layer 51b, the height of the Schottky barrier formed in the region is increased. In other words, the Schottky barrier formed in the contact region between anode electrode 53 and semiconductor layer 51 of capacitor SBD 5 is higher than the Schottky barrier formed in the contact region between anode electrode 13 and semiconductor layer 11 of rectifier SBD 1. Additionally, because thin-film insulating layer 55 is interposed, such capacitor SBD 5 is referred to also as "MIS Schottky diode".

Moreover, insulating layer 55 formed of $SiO_2$ or $Si_3N_4$ is known to form an interface state at an interface to active layer 51b. That is, insulating layer 55 formed of $SiO_2$ or $Si_3N_4$ increases a Fermi level of active layer 51b by negative charges charged on the interface state, and may thus further increase the Schottky barrier.

As described above, by interposing thin-film insulating layer 55 between anode electrode 53 and active layer 51b, a leakage current at capacitor SBD 5 may be further reduced. Additionally, from the standpoint of reducing the leakage current, insulating layer 55 according to the present embodiment is more suitable than low-concentration layer 51c in Embodiment 3.

As described above, with semiconductor device U according to the present embodiment, a power loss at capacitor SBD 5 may be reduced. Reduction in the conversion efficiency of power conversion at the time of rectifying operation of semiconductor device U may be thereby more reliably prevented.

These manufacturing methods are the same as those in Embodiment 3, and an insulator is selectively removed instead of semiconductor crystal.

Modification of Embodiment 4

Insulating layer 55 that is obtained by insulating (or semi-insulating; the same applies below) active layer 51b formed by ion implantation may be used instead of insulating layer 55 formed of $SiO_2$ or $Si_3N_4$ according to Embodiment 4.

For example, insulating layer 55 according to the present modification may be formed by ion implantation of fluorine ions, oxygen ions, boron ions or the like into semiconductor layer 51 (of GaN, for example). Furthermore, insulating layer 55 may also be formed by implantation of heavy metal or the like, instead of ion implantation.

In this case, ion implantation is selectively performed using a photoresist as a mask. Depending on a temperature of a necessary high-temperature activation process, ion implantation is selected to be performed before or after ohmic electrode annealing, which is a high-temperature process.

Embodiment 5

In the following, semiconductor device U according to Embodiment 5 will be described with reference to FIG. 17.

Figure 17:
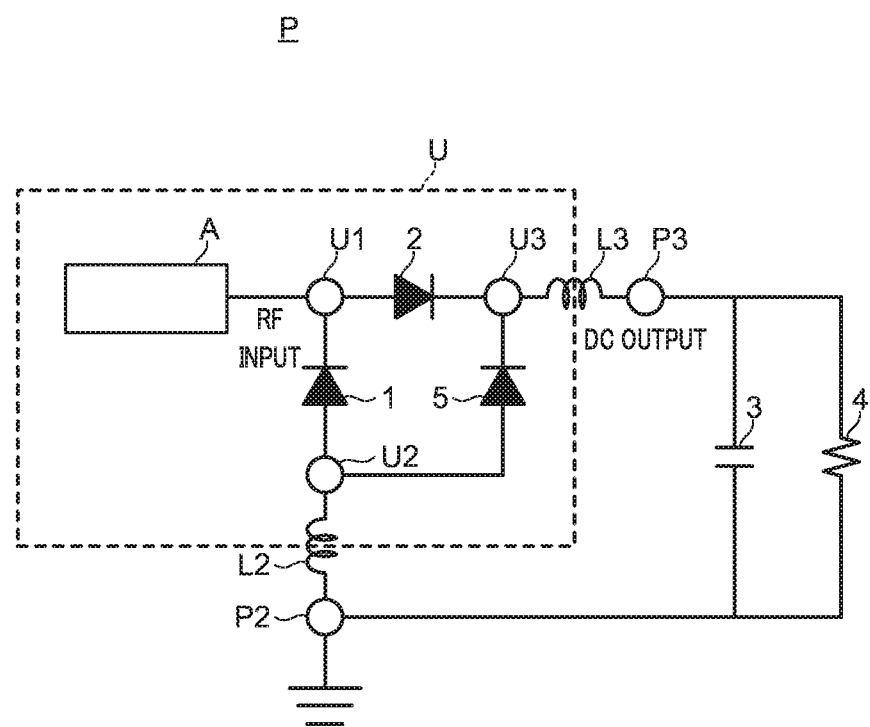
FIG. 17 is a diagram illustrating an example structure of a semiconductor device according to Embodiment 5.

FIG. 17 is a diagram illustrating an example structure of semiconductor device U according to the present embodiment.

Semiconductor device U according to the present embodiment is different from semiconductor device U according to Embodiment 1 in that antenna A is formed on a main surface of substrate Ua. Additionally, FIG. 17 corresponds to FIG. 2 in Embodiment 1.

As antenna A according to the present embodiment, a dipole antenna or the like is used, for example. This type of antenna A to be used to receive microwaves in a GHz band has a size of about several millimeters, and thus, may be integrally formed on the main surface of substrate Ua, together with first and second rectifier SBDs 1, 2 and capacitor SBD 5 described above.

With semiconductor device U according to the present embodiment, high-frequency power does not have to be input through wire-bonding L1, and thus, parasitic inductance caused by wire-bonding L1 may be avoided. Potential of each terminal U1, U2, U3 may be thereby more stabilized, and rectifying operation of first and second rectifier SBDs 1, 2 may be more stabilized.

Additionally, with semiconductor device U according to the present embodiment, input pad electrode 7 is not necessary, and the antenna forms an input section for receiving high-frequency power.

Other Embodiments

The present invention is not limited to the embodiments described above, and various modifications are conceivable.

The above-described embodiments describe various examples of the structure of semiconductor U according to the present invention. However, it is needless to say that the modes described in the embodiments may be combined in various ways.

Figure 18:
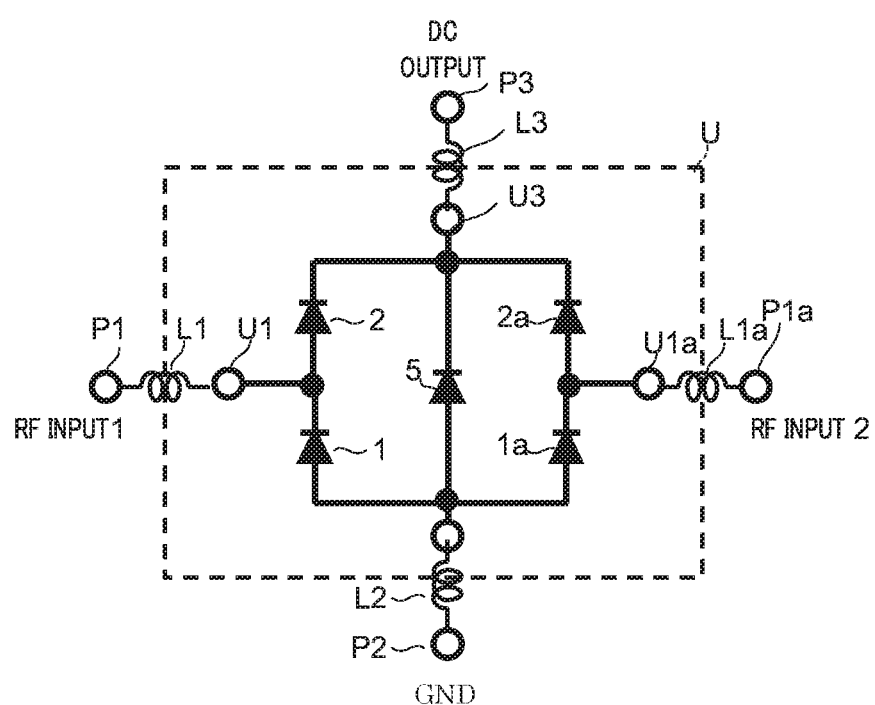
FIG. 18 is a diagram illustrating an example structure of a microwave rectifier circuit according to another embodiment.

FIG. 18 illustrates an example of applying semiconductor device U according to the present invention to a microwave rectifier circuit of a full wave rectification type.

Obviously, semiconductor device U according to the present invention may be applied not only to the voltage-doubler microwave rectifier circuit, but also to a microwave rectifier circuit of a full wave rectification type as illustrated in FIG. 18, for example. Additionally, in semiconductor device U in FIG. 18, second input terminal U1a, and rectifier diodes 1a and 2a are provided in addition to the structures described above. A negative voltage component of power that is received by antenna A (not illustrated in FIG. 18) is input to second input terminal U1a of semiconductor device U, through second terminal P1a and wire-bonding L1a on printed circuit board P'. Rectifier diodes 1a and 2a perform rectifying operation when AC power received by the antenna is reverse biased with respect to second rectifier SBD 2. Additionally, structure and operation of the microwave rectifier circuit of a full wave rectification type are the same as known structure, and a detailed description thereof is omitted; additionally, also with the microwave rectifier circuit of a full wave rectification type, by disposing capacitor SBD 5 described above, rectifier diodes 1, 2, 1a, and 2a may be enabled to perform stable rectifying operation.

Furthermore, the embodiments described above describe modes where semiconductor device U is mounted on printed circuit board P, for example, but it is needless to say that semiconductor device U may be mounted on circuit boards other than printed circuit board P. Moreover, also in the case of mounting semiconductor device U on printed circuit board P, flip-chip bonding or the like may be used instead of wire-bonding. An antenna may be formed in the chip instead of connecting AC input to the external terminal, and in such a case, wiring to the antenna is made the input terminal.

Furthermore, the embodiments described above describe a rectenna device as an example to which semiconductor device U is applied, but it is needless to say that semiconductor device U may also be applied to a power reception device that uses electromagnetic induction between coils.

Heretofore, specific examples of the present invention have been described in detail, but these are merely examples, and do not limit the scope of the claims. The technology described in the scope of the claims includes variations and modifications of the specific examples described above.

The disclosure of Japanese Patent Application No. 2017-145602, filed on Jul. 27, 2017, including the specification, drawings and abstract, is incorporated herein by reference in its entirety.

INDUSTRIAL APPLICABILITY

The semiconductor device according to the present disclosure enables stable rectifying operation.

REFERENCE SIGNS LIST

1 First rectifier SBD
2 Second rectifier SBD
3 Smoothing capacitor
4 Load resistor
5 Capacitor SBD
6 GND-connection pad electrode
7 Input pad electrode
8 Output pad electrode
11 Semiconductor layer
11a Access layer
11b Active layer
12 Cathode electrode
13 Anode electrode
14 Lead-out wire
21 Semiconductor layer
22 Cathode electrode
23 Anode electrode
24 Lead-out wire
51 Semiconductor layer
51a Access layer
51b Active layer
51c Low-concentration layer
52 Cathode electrode
53 Anode electrode
54 Lead-out wire
55 Insulating layer
U Semiconductor device
Ua Substrate
U1 Input terminal
U2 GND terminal
U3 Output terminal
L1, L2, L3 Wire-bonding
P1, P2, P3 External terminal
P Printed circuit board
A Antenna

What is claimed is:

1. A semiconductor device that forms a rectifier circuit, the semiconductor device comprising:
    a substrate including, on a main surface of the substrate, an input section to which AC rower is input from outside, a ground connection section that is connected to a ground formed outside, an output section that outputs rectified DC power to outside, and a semiconductor layer,
    a first Schottky diode that is formed in a first region of the semiconductor layer, with a cathode electrode being connected to the input section and an anode electrode being connected to the around connection section;
    a second Schottky diode that is formed in a second region of the semiconductor layer, with a cathode electrode being connected to the output section and an anode electrode being connected to the input section; and
    a third Schottky diode that is formed in a third region of the semiconductor layer, with a cathode electrode being connected to the output section and an anode electrode being connected to the ground connection section,
    wherein the anode electrodes of the first and the second Schottky diodes have a dot-shaped electrode structure in planar view, and the anode electrode of the third Schottky diode has a finger-shaped electrode structure in planar view.

2. The semiconductor device according to claim 1, wherein the input section is an antenna that is formed on the main surface of the substrate.

3. The semiconductor device according to claim 1, wherein the input section is an input pad electrode that is connected to a circuit board outside the substrate by wire-bonding.

4. The semiconductor device according to claim 1, wherein the ground connection section and the output section are, respectively, a ground connection pad electrode and an output pad electrode that are connected to a circuit board outside the substrate by wire-bonding.

5. A semiconductor device that forms a rectifier circuit, the semiconductor device comprising:
    a substrate including, on a main surface of the substrate, an input section to which AC power is input from outside, a ground connection section that is connected to a ground formed outside, an output section that outputs rectified DC power to outside, and a semiconductor layer;
a first Schottky diode that is formed in a first region of the semiconductor layer, with a cathode electrode being connected to the input section and an anode electrode being connected to the ground connection section;
a second Schottky diode that is formed in a second region of the semiconductor layer, with a cathode electrode being connected to the output section and an anode electrode being connected to the input section; and
a third Schottky diode that is formed in a third region of the semiconductor layer, with a cathode electrode being connected to the output section and an anode electrode being connected to the around connection section,
wherein a work function of Schottky contact metal of the anode electrode of the third Schottky diode is larger than a work function of Schottky contact metal of the anode electrode of either of the first and the second Schottky diodes.

6. A semiconductor device that forms a circuit, the semiconductor device comprising:
a substrate including, on a main surface of the substrate, an input section to which AC power is input from outside, a ground connection section that is connected to a ground formed outside, an output section that outputs rectified DC power to outside, and a semiconductor layer;
a first Schottky diode that is formed in a first region of the semiconductor layer, with a cathode electrode being connected to the input section and an anode electrode being connected to the ground connection section;
a second Schottky diode that is formed in a second region of the semiconductor layer, with a cathode electrode being connected to the output section and an anode electrode being connected to the input section; and
a third Schottky diode that is formed in a third region of the semiconductor layer, with a cathode electrode being connected to the output section and an anode electrode being connected to the ground connection section,
wherein the semiconductor layer with which the anode electrode of the third Schottky diode is in contact includes, in a region where they contact with each other, a low-concentration layer with a lower doping concentration than the semiconductor layer with which the anode electrode of either of the first and the second Schottky diodes is in contact.

7. A semiconductor device that forms a rectifier circuit, the semiconductor device comprising:
a substrate including, on a main surface of the substrate, an input section to which AC power is input from outside, a ground connection section that is connected to a ground formed outside, an output section that outputs rectified DC power to outside, and a semiconductor layer;
a first Schottky diode that is formed in a first region of the semiconductor layer, with a cathode electrode being connected to the input section and an anode electrode being connected to the ground connection section;
a second Schottky diode that is formed in a second region of the semiconductor layer, with a cathode electrode being connected to the output section and an anode electrode being connected to the input section; and
a third Schottky diode that is formed in a third region of the semiconductor layer, with a cathode electrode being connected to the output section and an anode electrode being connected to the ground connection section,
wherein the semiconductor layer with which the anode electrode of the third Schottky diode is in contact includes, in a region where they contact with each other, an opposite conductivity-type layer that is doped to opposite conductivity type from the semiconductor layer with which the anode electrode of either of the first and the second Schottky diodes is in contact.

8. A semiconductor device that forms a rectifier circuit, the semiconductor device comprising:
a substrate including, on a main surface of the substrate, an input section to which AC power is input from outside, a ground connection section that is connected to a ground formed outside, an output section that outputs rectified DC power to outside, and a semiconductor layer;
a first Schottky diode that is formed in a first region of the semiconductor layer, with a cathode electrode being connected to the input section and an anode electrode being connected to the ground connection section;
a second Schottky diode that is formed in a second region of the semiconductor layer, with a cathode electrode being connected to the output section and an anode electrode being connected to input section; and
a third Schottky diode that is formed in a third region of the semiconductor layer, with a cathode electrode being connected to the output section and an anode electrode being connected to the ground connection section,
wherein the semiconductor layer with which the anode electrode of the third Schottky diode is in contact includes, in a region where they contact with each other, a wide band gap semiconductor layer with a wider band gap than the semiconductor layer with which the anode electrode of either of the first and the second Schottky diodes is in contact.

9. A semiconductor device that forms a rectifier circuit, the semiconductor device comprising:
a substrate including, on a main surface of the substrate, an input section to which AC power is input from outside a ground connection section that is connected to a ground formed outside, an output section that outputs rectified DC power to outside, and a semiconductor layer;
a first Schottky diode that is formed in a first region of the semiconductor layer, with a cathode electrode being connected to the input section and an anode electrode being connected to the ground connection section;
a second Schottky diode that is formed in a second region of the semiconductor layer, with a cathode electrode being connected to the output section and an anode electrode being connected to the input section; and
a third Schottky diode that is formed in a third region of the semiconductor layer, with a cathode electrode being connected to the output section and an anode electrode being connected to the ground section,
wherein the third Schottky diode includes a thin-film insulating layer at a contact region where the anode electrode is in contact with the semiconductor layer.

10. A semiconductor device that forms a rectifier circuit, the semiconductor device comprising:
a substrate including, on a main surface of the substrate, an input section to which AC power is input from outside, a ground connection section that is connected to a ground formed outside, an output section that outputs rectified DC power to outside, and a semiconductor layer;
a first Schottky diode that is formed in a first region of the semiconductor layer, with a cathode electrode being connected to the input section and an anode electrode being connected to the ground connection section;

a second Schottky diode that is formed in a second region of the semiconductor layer, with a cathode electrode being connected to the output section and an anode electrode being connected to the input section; and a third Schottky diode that is formed in a third region of the semiconductor layer, with a cathode electrode being connected to the output section and an anode electrode being connected to the ground connection section, wherein an area of the anode electrode of the third Schottky diode is ten or more times an area of the anode electrode of either of the first and the second Schottky diodes in planar view.

* * * * *